United States Patent
Rivera-Poventud et al.

(10) Patent No.: US 9,467,000 B2
(45) Date of Patent: Oct. 11, 2016

(54) INTELLIGENT INDEPENDENT BATTERY MANAGEMENT SYSTEM AND METHOD

(71) Applicant: Raytheon Company, Waltham, MA (US)

(72) Inventors: John B. Rivera-Poventud, Clinton, MA (US); Alf L. Carroll, III, Marion, MA (US); William R. Faries, El Segundo, CA (US); Tsz Yip, Woburn, MA (US); Mike L. Anderson, Nashua, NH (US); Nicholas Brannen, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 671 days.

(21) Appl. No.: 13/907,535

(22) Filed: May 31, 2013

(65) Prior Publication Data
US 2014/0354213 A1    Dec. 4, 2014

(51) Int. Cl.
*H02J 7/00* (2006.01)
*H02J 7/16* (2006.01)
*H02J 7/04* (2006.01)
*G01R 31/36* (2006.01)

(52) U.S. Cl.
CPC ......... *H02J 7/0068* (2013.01); *G01R 31/3658* (2013.01); *H02J 7/0016* (2013.01); *H02J 7/0077* (2013.01); *G01R 31/361* (2013.01); *G01R 31/3651* (2013.01)

(58) Field of Classification Search
CPC .................................................... H02J 7/0047
USPC ........................................................ 320/132
See application file for complete search history.

(56) References Cited

U.S. PATENT DOCUMENTS

| | | | | |
|---|---|---|---|---|
| 2010/0121511 A1* | 5/2010 | Onnerud | ............ | B60L 11/1851 701/22 |
| 2014/0009123 A1* | 1/2014 | Park | ..................... | G01R 31/361 320/152 |

* cited by examiner

*Primary Examiner* — Edward Tso
*Assistant Examiner* — Ahmed Omar

(57) ABSTRACT

According to an embodiment of the disclosure, a method for monitoring a battery pack is provided. The battery pack includes a plurality of modules and a pack controller, and each module includes a corresponding module controller. For each module, the method includes measuring a module current and measuring a module voltage. The measured module current and the measured module voltage are compared to state of health (SOH) data in at least one dynamic look-up table. A state of charge for the module is determined based on the comparison of the measured module current and the measured module voltage to the SOH data in the dynamic look-up table. For a particular embodiment, the dynamic look-up table is initially configured based on a type of battery chemistry for the battery pack, and after each charge cycle for the module, the dynamic look-up table is updated based on empirical data for the module.

20 Claims, 9 Drawing Sheets

INTELLIGENT INDEPENDENT BATTERY MANAGEMENT SYSTEM AND METHOD

TECHNICAL FIELD

The present disclosure is directed, in general, to battery technology and, more specifically, to an intelligent independent battery management system and method.

BACKGROUND OF THE DISCLOSURE

Traditional battery companies have developed battery management systems specific to their respective types of batteries. These battery management systems are typically unable to be implemented with different battery technologies. Thus, when a new battery technology is developed, a new battery management system generally has to be developed for that technology.

SUMMARY OF THE DISCLOSURE

This disclosure provides an intelligent independent battery management system and method.

In one embodiment, a method for monitoring a battery pack is provided. The battery pack includes a plurality of modules and a pack controller, and each module includes a corresponding module controller. For each module, the method includes measuring a module current and measuring a module voltage. The measured module current and the measured module voltage are compared to state of health (SOH) data in at least one dynamic look-up table. A state of charge for the module is determined based on the comparison of the measured module current and the measured module voltage to the SOH data in the dynamic look-up table.

In another embodiment, a battery pack is provided that includes a pack controller and a plurality of modules. Each module includes a corresponding module controller and a plurality of cells. Each module controller is configured to measure a module current, to measure a module voltage, to compare the measured module current and the measured module voltage to state of health (SOH) data in at least one dynamic look-up table, and to determine a state of charge for the module based on the comparison of the measured module current and the measured module voltage to the SOH data in the dynamic look-up table. The pack controller is configured to communicate with the module controllers to monitor the state of charge for each of the modules. The dynamic look-up table is initially configured based on a type of battery chemistry for the battery pack. The module controller is further configured to update the dynamic look-up table based on empirical data for the module after each charge cycle for the module.

In yet another embodiment, a module controller for a module in a battery pack is provided. The battery pack includes a pack controller and a plurality of modules. The module controller includes a current sensor configured to measure a module current, a voltage sensor configured to measure a module voltage, a temperature sensor configured to measure a module temperature, and a dynamic look-up table configured to store state of health (SOH) data for the module. Each module controller also includes a state monitor that is configured to monitor a state of health and a state of charge for the module based on the module current, the module voltage, the module temperature, and the SOH data. The dynamic look-up table is initially configured based on a type of battery chemistry for the battery pack and, after each charge cycle for the module, is updated based on empirical data for the module.

Other technical features may be readily apparent to one skilled in the art from the following figures, descriptions, and claims.

BRIEF DESCRIPTION OF THE DRAWINGS

For a more complete understanding of the present disclosure, reference is now made to the following description taken in conjunction with the accompanying drawings, in which.

DETAILED DESCRIPTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented using any number of techniques, whether currently known or not. Additionally, the drawings are not necessarily drawn to scale.

As described above, when a new battery technology is developed, a new battery management system generally has to be developed for that technology. Additionally, traditional battery management systems become less accurate in measuring state of charge over time, as the cycle life of a battery depletes. Therefore, this disclosure provides a single battery management system that may be implemented across different types of batteries, while intelligently monitoring the parameters used to report accurately the state of charge, even as the battery depletes. State of charge (SOC) accuracy affects the determination of the power remaining on current charge and affects the sensing of when to start charging and stop charging a battery system. Inaccurate SOC measurements may cause non-optimal charging and discharging conditions that reduce the battery's life, while accurately monitoring the state of charge can extend the life of a battery system and provide better situational awareness.

Figure 1:
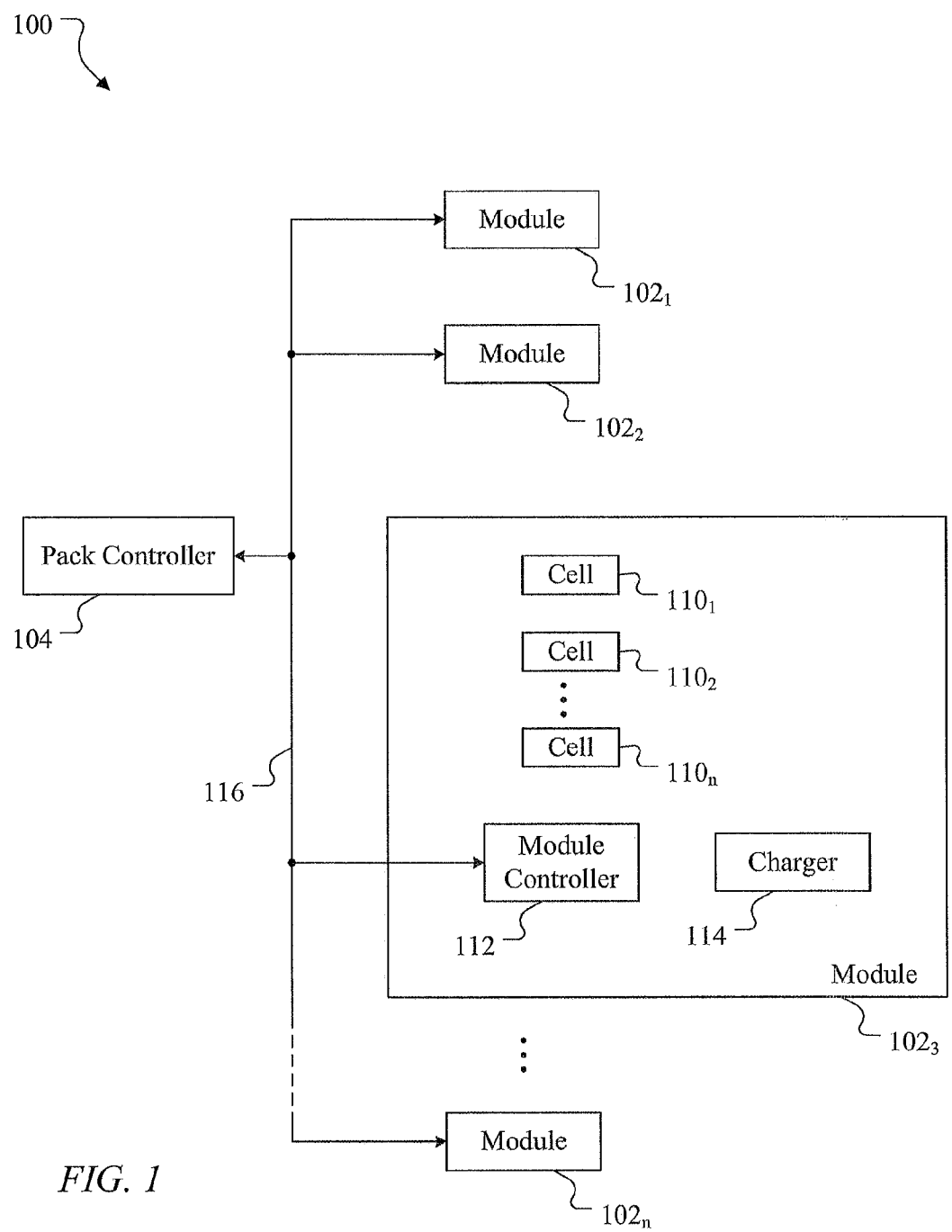
FIG. 1 illustrates a battery pack in accordance with the present disclosure.

FIG. 1 illustrates a battery pack 100 in accordance with the present disclosure. The embodiment of the pack 100 shown in FIG. 1 is for illustration only. Other embodiments of the pack 100 could be used without departing from the scope of this disclosure.

The battery pack 100 comprises a plurality of modules 102 and a pack controller 104. Each module 102 comprises a plurality of cells 110, a module controller 112 and a charger 114. Each individual cell 110 is a package that is capable of delivering electrical power. Each module 102 comprises multiple cells 110 coupled together in series and/or in parallel, and the battery pack 100 is assembled by coupling the modules 102 together in series and/or in parallel (not shown in FIG. 1).

As described in more detail below, the pack controller 104 is configured to control the operation of the pack 100 by communicating with the module controller 112 in each module 102. For example, the pack controller 104 may be configured to command the module 102 to provide a status report, to charge the module 102, to discharge the module 102 or to disconnect the module 102 in the event of an unsafe condition. The status report command is a request from the pack controller 104 to poll data from the module controller 112. For example, the data may comprise SOC, state of health (SOH), voltage and current levels and/or any other suitable data.

Each module controller 112 is configured to control its corresponding module 102 based on internal algorithms and/or command signals received from the pack controller 104. The pack controller 104 may receive information regarding a module 102 from its corresponding module controller 112 and may provide operating instructions to the module 102 through the module controller 112. For some embodiments, the pack controller 104 may be coupled to the module controllers 112 through fiber optic lines 116.

The charger 114 is configured to charge or discharge the cells 110 of the corresponding module 102. Based on a command signal from the pack controller 104, the module controller 112 may provide a command signal to the charger 114 to prompt the charger 114 to charge or discharge the cells 110. The use of a module-level battery charger 114 allows the power rating to be smaller as compared to using a battery charger for the pack 100.

The charger 114 may be configured to provide a constant current until the charge of the module 102 reaches a specified percentage, such as 90%, of the capacity of the module 102. The current may then taper off significantly once the bulk of the charge has occurred. The charger 114 may then provide a constant voltage until the capacity of the module 102 reaches substantially 100%. To accomplish this, the charger 114 may limit the current to a minimum charge current level. However, it will be understood that the charger 114 may be configured to charge the module 102 in any other suitable manner. For example, the module controller 112 may be configured to command the charger 114 to accept different charge rates to accommodate pulse charging the storage.

If the module controller 112 receives the command signal to charge from the pack controller 104, the module controller 112 may prompt the charger 114 to provide the proper current level based on a predefined value from the pack controller 104. The module controller 112 may ensure that the power supplied by the charger 114 is approximately the same as the power received by the module 102. During charging, the module controller 112 may recall the last known stored energy value (Amp-hr) to reduce the time to charge as the module 102 is holding some charge left from the previous operation.

For some embodiments, the pack controller 104 may also be configured to monitor the number of charge cycles for each module 102 and, when the number of charge cycles reaches a predetermined value, to provide a command signal to the corresponding module controller 112 prompting the module controller 112 to fully discharge the module 102.

As described in more detail below, the pack controller 104 and the module controllers 112 are configured to implement an intelligent independent battery management system. The battery management system is intelligent in that the algorithm makes it an intelligent system for control and is independent in that it may be implemented with any suitable type of battery chemistry, such as lead acid, lithium ion, nickel cadmium or the like, instead of being limited to one particular type of battery chemistry.

Although FIG. 1 illustrates one example of a battery pack 100, various changes may be made to FIG. 1. For example, the makeup and arrangement of the pack 100 are for illustration only. Components could be added, omitted, combined, subdivided, or placed in any other suitable configuration according to particular needs.

Figure 2:
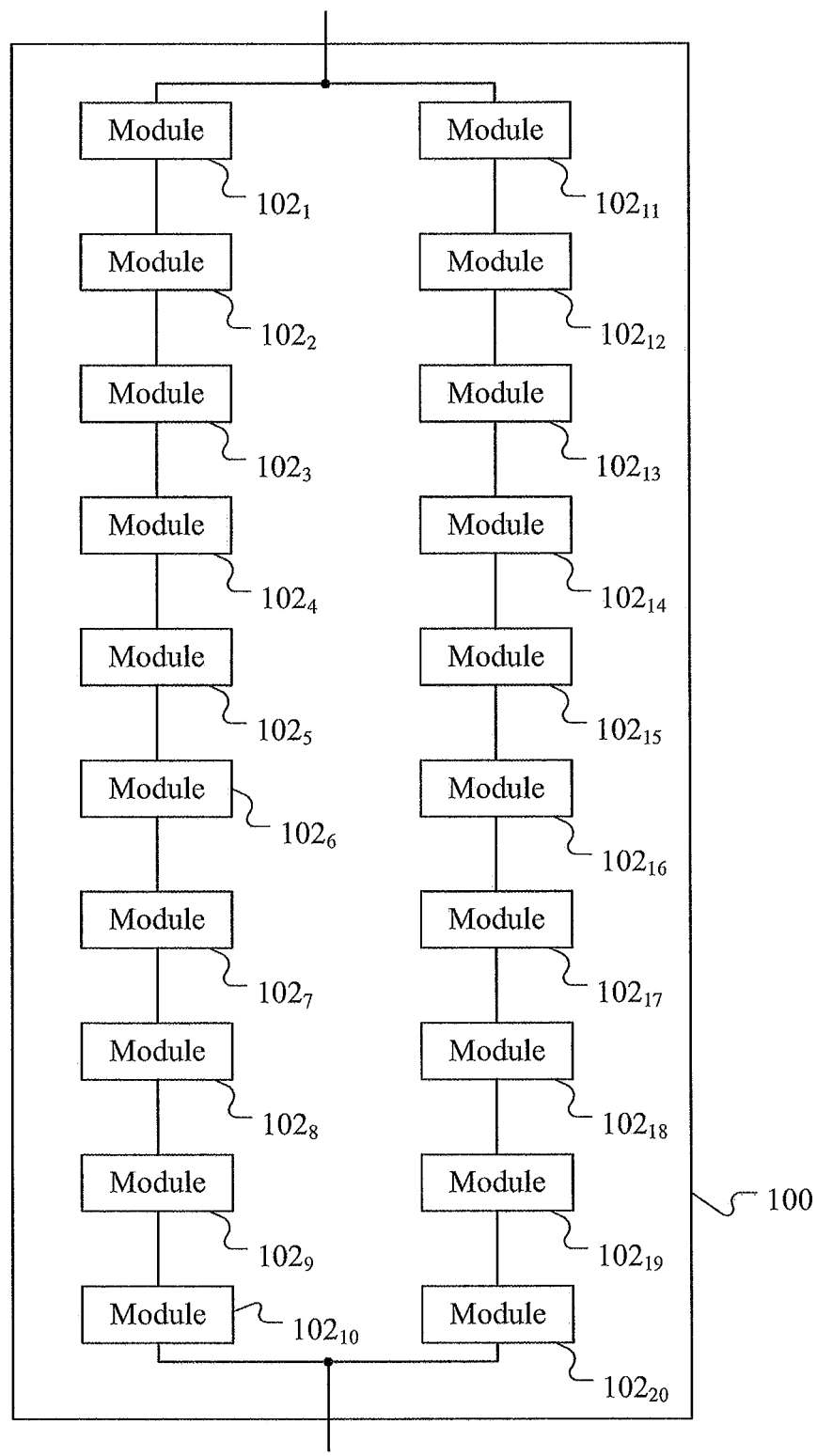
FIG. 2 illustrates an example of the battery pack of FIG. 1 in accordance with the present disclosure.

FIG. 2 illustrates an example of the battery pack 100 in accordance with a particular embodiment of the present disclosure. For this example, the pack 100 comprises a first string of ten modules $102_{1-10}$ coupled in series and a second string of ten modules $102_{11-20}$ coupled in series, with the two strings of modules 102 coupled in parallel. However, it will be understood that a pack 100 may comprise any suitable number of sets of series-coupled or parallel-coupled modules 102 that are in turn coupled to each other in parallel or series. For the illustrated embodiment in which each set comprises multiple modules 102 coupled in series, a higher voltage may be provided at the pack level than would be possible otherwise.

Figure 3:
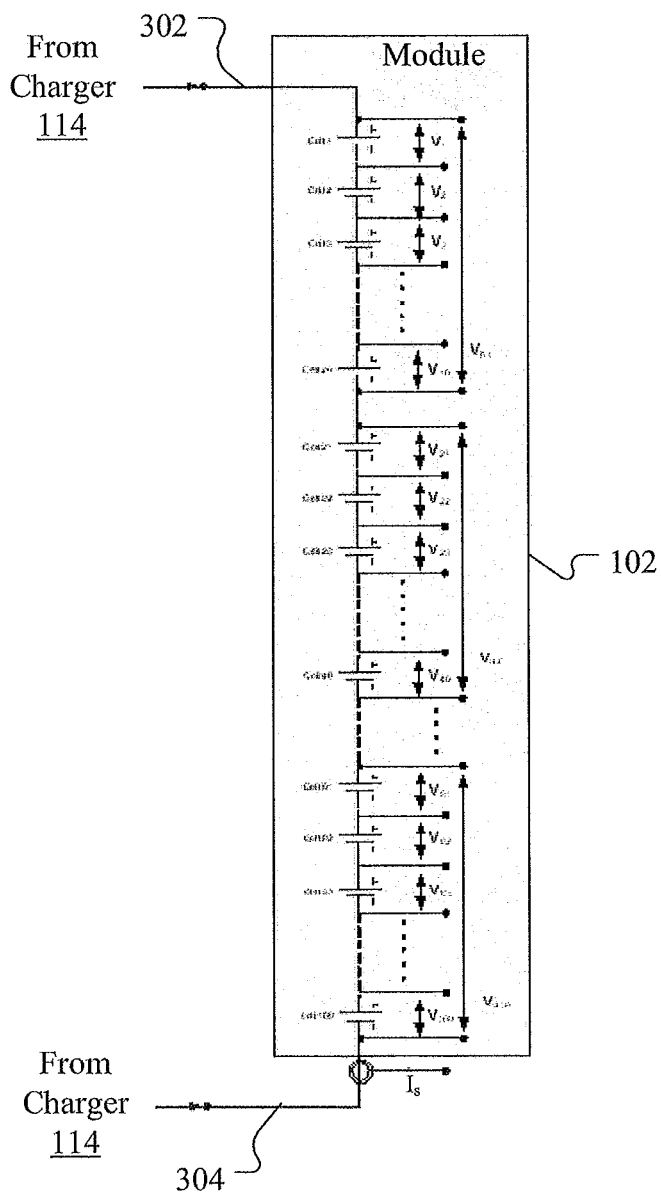
FIG. 3 illustrates an example of one of the modules of FIG. 1 or FIG. 2 in accordance with the present disclosure.

FIG. 3 illustrates an example of one of the modules 102 in accordance with a particular embodiment of the present disclosure. For this example, the module 102 comprises 100 cells 110 coupled in series. A voltage may be measured across each cell 110. In addition, the cells 110 are grouped in sets of twenty to allow for voltage measurements across each set of twenty cells 110.

The module 102 may be configured to receive control signals 302 and 304 from the charger 114 and to provide a current measurement, $I_s$, for the module 102. For example, the control signals 302 and 304 may cause the cells 100 of the module 102 to be charged or discharged.

Each of the cells 110 in the module 102 is configured to fail as a short. This reduces the complexity of the electronics and peripheral circuits as the module 102 can operate in a slightly degraded condition with a failed cell 110. For example, for some embodiments, a loss of a cell 110 may reduce the capacity of the module 102 by approximately 1%. Thus, when a cell 110 fails, the module 102 may be charged normally as the discrepancy is only about 1%. A cell failure may be identified by measuring the voltage of the module 102. The pack controller 104 may be configured to lower the charge voltage to compensate when multiple cells 110 fail.

Figure 4:
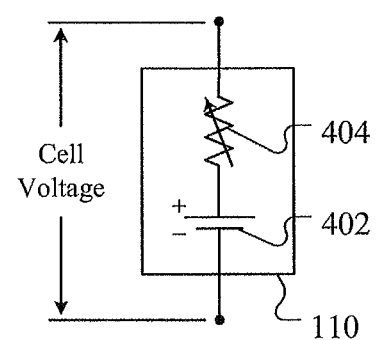
FIG. 4 illustrates an electrical model of one of the cells of FIG. 1 or FIG. 3 in accordance with the present disclosure.

FIG. 4 illustrates an electrical model of one of the cells 110 in accordance with the present disclosure. The model comprises an open circuit voltage 402 and an internal resistance 404. The internal resistance 404 of the cell 110 is a function of the charge/discharge characteristics and state of charge of the cell 110. Therefore, any suitable value may be used for the internal resistance 404 of the cell 110 based on the characteristics and charge of the cell 110. For practical applications, the internal resistance 404 can be taken from a dynamic look-up table based on experimental data.

Figure 5:
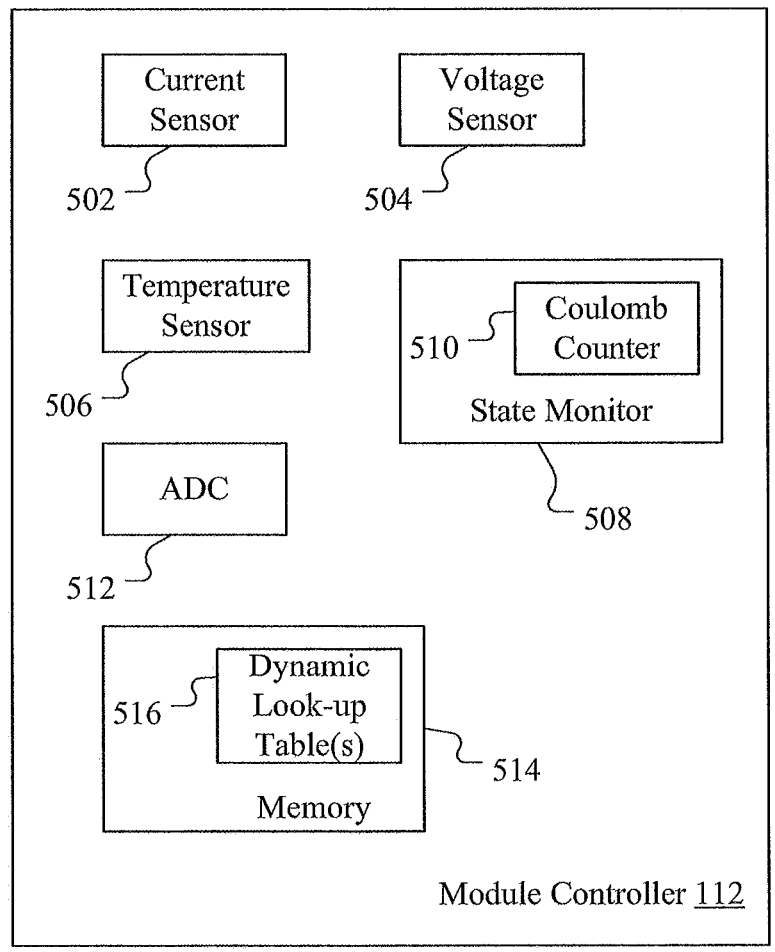
FIG. 5 illustrates a block diagram of the module controller of FIG. 1 in accordance with the present disclosure.

FIG. 5 illustrates a block diagram of the module controller 112 in accordance with the present disclosure. The embodiment of the module controller 112 shown in FIG. 5 is for illustration only. Other embodiments of the module controller 112 could be used without departing from the scope of this disclosure.

The module controller 112 comprises a current sensor 502, a voltage sensor 504, a temperature sensor 506, and a state monitor 508, which further comprises a Coulomb counter 510. The module controller 112 also comprises an analog-to-digital converter (ADC) 512 and a non-volatile memory 514, which further comprises one or more dynamic look-up tables 516, in addition to any other suitable components.

The current sensor 502 may comprise a shunt resistor, a Hall effect current sensor or other suitable component configured to determine current in and out of the module 102. Compared to a Hall effect sensor, a shunt resistor may provide a better instantaneous response when sensing current, but it dissipates power as a function of the current flowing through it. For example, a shunt resistor rated for 500 A has a resistance of 0.2-milli-Ohm. The power dissipation for the shunt resistor is 24.5 W when 350 A flows through it. The contact connections also result in additional losses.

However, a Hall effect sensor can be used in applications that cannot handle the power dissipation of a shunt resistor. Possible sensors could be HTA-1000-S from LEM or CS500 from ABB. A drawback is that the Hall effect sensor has a frequency bandwidth in the kHz range, making it undesirable for situations that require faster response time. Also, Hall effect sensors can drift over time, and some have an analog output that has to be converted by the ADC 512. The use of either a shunt resistor or a Hall effect sensor for the current sensor 502 is a trade-off to determine per the application of the battery pack 100.

The voltage sensor 504 is configured to measure the voltage of the module 102. For the embodiment of FIG. 3, the voltage sensor 504 may be configured to measure the voltage across each cell 110 and across each set of twenty cells 110, in addition to the overall module voltage. The temperature sensor 506 is configured to determine whether the battery container is breached based on the sensed temperature and, when the container is breached, to notify the module controller 112 of a fault condition.

The module controller 112 is configured to report a fault condition to the pack controller 104 if an over- or under-voltage is measured by the voltage sensor 504 for the module 102 or if the module 102 does not hold charge properly. The state monitor 508 is configured to calculate both the state of charge (SOC) and the state of health (SOH) of the module 102.

Measurements generated by the sensors 502, 504 and/or 506 may be analog measurements. Thus, the ADC 512 is configured to convert these analog measurements into digital signals. The module controller 112 is also configured to store the digital signals in the memory 514 and to send these signals to the pack controller 104 when requested.

The current sensor 502 is configured to measure the current in and/or out of the corresponding module 102 and to provide the measured current to the state monitor 508. Based on the current measurement provided by the current sensor 502, the state monitor 508 is configured to ensure there is not an over-current condition for the module 102. In addition, the state monitor 508 is configured to integrate the current over time to determine the battery charge. Based on the monitoring of the module's current, the state monitor 508 is configured to calculate how much of the battery capacity remains or how long a charging operation will take for the module 102.

The voltage sensor 504 is configured to measure the voltage of the corresponding module 102 and to provide the measured voltage to the state monitor 508. The state monitor 508 is configured to determine whether the voltage is approaching an under-voltage threshold or is above an over-voltage threshold. If either of these conditions exists, the module controller 112 is configured to report the condition to the pack controller 104.

Table 1 presents the different voltage values that may be used for some embodiments. The state monitor 508 may use the voltage measurement to determine if any cell 110 of the module 102 is failing as a short. The voltages may be expressed in a Per Unit (PU) system using a nominal voltage for each cell 110 based on the type of battery cell. For example, Table 1 shows examples using lead acid, lithium ion and nickel cadmium as bases for the PU system.

TABLE 1

| Per Unit Voltage Values per Battery Chemistry | | | | | |
|---|---|---|---|---|---|
| | Lead Acid | | Lithium Ion | | Nickel Cadmium | |
| | Actual | Per Unit | Actual | Per Unit | Actual | Per Unit |
| Base Cell Voltage | 2.1 V | 1.0 | 3.6 V | 1.0 | 1.2 V | 1.0 |
| Charge Cut Off (Vc) | 2.4 V | 1.14 | 4.2 V | 1.17 | 1.4 V | 1.17 |
| Discharge Cut Off (Vd) | 1.75 V | 0.83 | 2.5 V | 0.69 | 0.8 V | 0.66 |

Thus, for a lead acid battery, for example, the base cell voltage is adjusted from an actual value of 2.1V to 1.0 pu (by definition). The charge cut off and discharge cut off are both then similarly adjusted by dividing the actual values by 2.1V to obtain the Per Unit equivalents. Therefore, regardless of the particular battery chemistry, the base cell voltage may be expressed as 1.0 pu, and the cut off values may be calculated in the PU system based on the actual values.

The temperature sensor 506 may also comprise a negative temperature coefficient (NTC) thermistor that is configured to measure the battery module's case temperature. The NTC thermistor may be placed close to the battery surface to ensure that the cells 110 are within a safe operating range.

The module controller 112 is configured to report the status of the module 102 to the pack controller 104. The module controller 112 is configured to operate semi-autonomously from the pack controller 104. The module controller 112 is responsible for reporting battery conditions to the pack controller 104 but may also be responsible for the discharge profile to prevent a single point of failure during its operation. The pack controller 104 is responsible for determining the optimal voltage to maximize the charge of the parallel modules 102 and, thus, may be responsible for the charge operation.

The module controller 112 may comprise field-programmable gate arrays (FPGAs) for analyzing the module data. For example, the module controller 112 may comprise FPGAs from the Spartan family from Xilinx or other suitable FPGAs. In addition, the module controller 112 may comprise optical transceiver chips for converting the digital signals from the FPGAs into optical signals and transceivers for transmitting and receiving data using fiber optic lines 116. Fiber optic lines 116 between the module controllers 112 and the pack controllers 104 offer electrical isolation between the end points as there is no electrical current in the fiber optic lines 116. This is useful when dealing with battery modules 102 where differences in ground potentials may be high. Additionally, fiber optic lines 116 are immune to electromagnetic interference.

The pack controller 104 is configured to measure the open circuit voltage (OCV) of the battery pack 100. For some embodiments, such as for a lead acid battery, for example, if the voltage of a module 102 is higher than 1.1 pu, the module 102 is assumed to be fully charged (i.e., SOC=100%). If the OCV is less than 1.1 pu, then the module controller 112 may notify the pack controller 104 that the module 102 is to be charged. If after four hours of applying C/4 the module 102 cannot reach an OCV of 1.7 pu, then the module controller 112 may notify the pack controller 104 that the module 102 is defective (where C is defined as the discharge current rate at which the battery capacity of the module 102 will be depleted in one hour). It will be understood that for other embodiments or other battery types, different values may be used for the operational set-points and thresholds.

The Coulomb counter 510 is configured to measure the charge added to or subtracted from the module 102 to calculate the capacity of the module 102. To do this, the Coulomb counter 510 may be configured to continuously monitor the current into the module 102 from charging and the current delivered to the load. The current may be given by the equation:

$$Is(t)=q(t)/dt,$$

where Is(t) is measured in A, q(t) is measured in Coulombs, and dt is measured in seconds. Also, charge may be calculated by integrating the current over time, as follows:

$$q(t) = q0 + \frac{1}{\text{efficiency}} * \int I(t)dt,$$

where q0 is the initial charge measured in Coulombs. The charge in a module 102 is measured in Ah, and 1 Ah=3600 Coulombs.

$$\text{Charge(Ah)} = 1/3600\left(q0 + \frac{1}{\text{efficiency}} * \int I(t)dt\right)$$

The efficiency is a function of the battery's internal resistance and state of charge.

The available storage energy in the module 102 decreases with each discharge. For one estimate, the discharge may be about 10%/1,000 discharges. The module 102 may have about 4,000 discharges at 100% depth of discharge at a 1-C rate before replacement is desirable.

The module controller 112 is configured to verify that the rate of discharge does not exceed a discharge cut-off current. For example, for some embodiments, the discharge cut-off current may be C/2. The module controller 112 may be configured to continuously update charge/discharge profiles to coincide with a most recent C rate of the module 102 based on its latest SOH. The module controller 112 may also be configured to continuously update the C rate to maintain an accurate charge and discharge rate to maximize life and minimize alert conditions of the module 102. If the battery voltage reaches a discharge cut-off voltage, the module controller 112 may be configured to report an alert condition to the pack controller 104. The pack controller 104 is configured to determine whether to charge or keep discharging.

The state of health of the module 102 is its ability to accept and keep the charge, as well as its current capacity. Due to aging, the number of charge/discharge cycles, cell failures and other factors, the capacity of the module 102 will decrease over its lifetime. Determining whether the module 102 should be replaced may be based on the condition of the module 102. The state of health, or SOH, may be calculated as follows:

SOH=current module capacity/original battery capacity.

For some embodiments, the SOH may be calculated at the end of each discharge cycle.

The module controller 112 may maintain SOH data in the dynamic look-up tables 516 in the memory 514 based on aging, cycle life, cell failures and other factors. The module controller 112 may continuously update a table 516 for each factor using an algorithm that incorporates manufacturer-specified data initially but that adapts based on actual history for the module 102. Accurate measurements of the SOH for the module 102 are useful for limiting the C rate of charge and discharge to maximize the life of the module 102 and determine a replacement schedule.

The Coulomb counter 510 may be configured to have the following interfaces with the pack controller 104: state of health, voltage level, stored energy (Ah), and fault status. The Coulomb counter 510 may also be configured to report the following fault signals to the pack controller 104: an over-voltage signal (if the voltage of the module 102 exceeds the overvoltage threshold), an under-voltage signal (if the voltage of the module 102 goes below the under-voltage threshold), and an over-current signal (if the current of the module 102 is above the discharge cut-off current). If any of these signals is triggered, the module controller 112 may report the signal to the pack controller 104.

Although FIG. 5 illustrates one example of a module controller 112, various changes may be made to FIG. 5. For example, the makeup and arrangement of the module controller 112 are for illustration only. Components could be added, omitted, combined, subdivided, or placed in any other suitable configuration according to particular needs.

Figure 6:
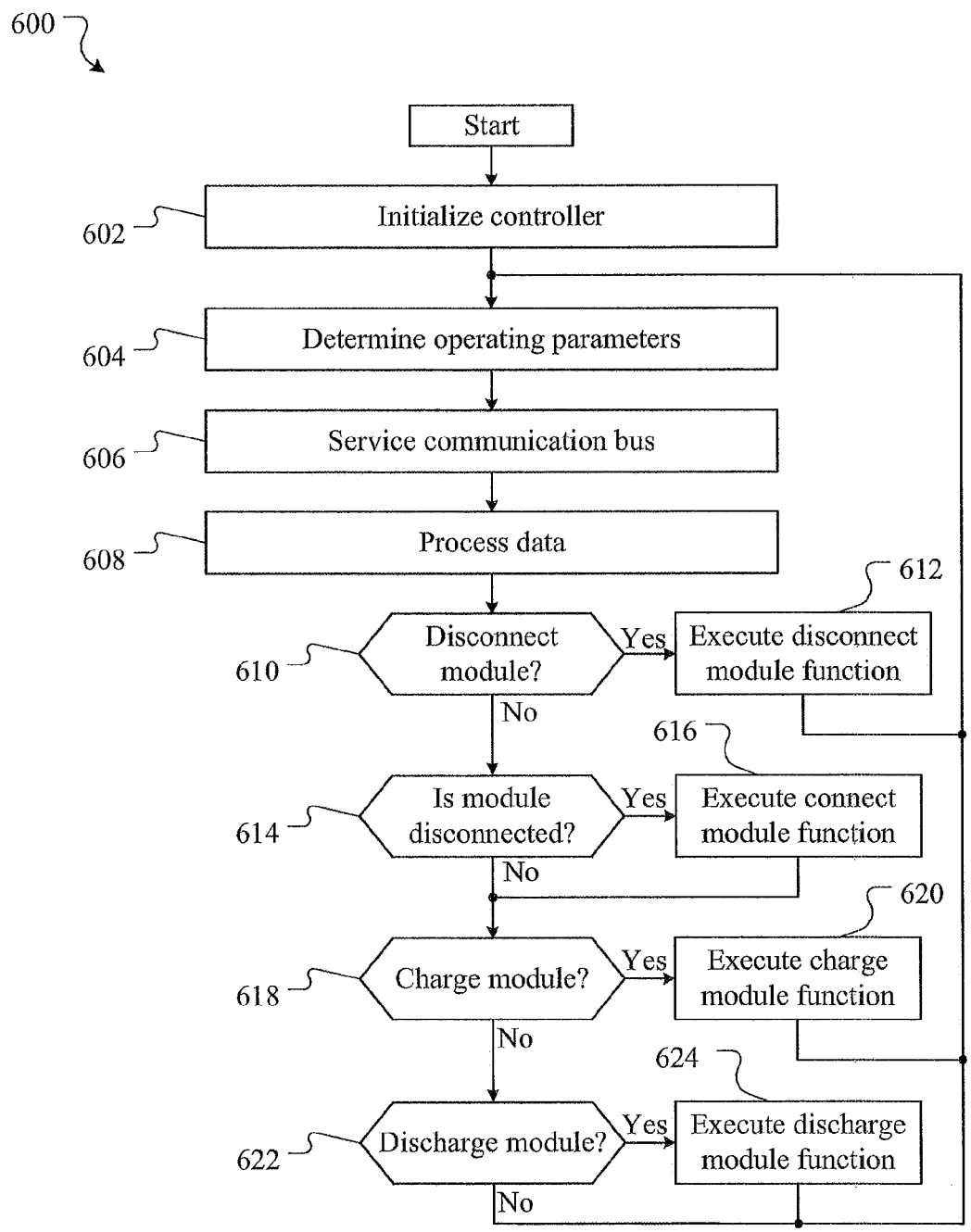
FIG. 6 is a flowchart illustrating a method for monitoring a state of charge for a battery using the module controller of FIG. 1 or FIG. 5 in accordance with the present disclosure.

FIG. 6 is a flowchart illustrating a method 600 for monitoring a state of charge for a battery using the module controller 112 in accordance with the present disclosure. The method 600 shown in FIG. 6 is for illustration only. Monitoring the state of charge may be provided in any other suitable manner without departing from the scope of this disclosure. In addition, the method 600 is described with respect to a single module 102; however, it will be understood that the method 600 may be performed for each module 102 in a pack 100.

During startup, the module controller 112 will initialize itself (step 602). For example, the module controller 112 may initialize a communications link, configure peripheral ports and interrupts, and clear variables. Then the module controller 112 determines operating parameters (step 604). For example, the module controller 112 may measure the temperature and electrical parameters of the module 102. The module controller 112 may also retrieve a current state of charge (SOC) from memory 514. This data may be used to calculate the state of health (SOH) and an updated SOC. The module controller 112 then services the communication bus (step 606) and processes data (step 608).

If the pack controller 104 detects an alert condition for the module 102, the pack controller 104 sends a disconnect command to the module controller 112. Alternatively, the module controller 112 may itself determine that an alert condition exists for the module 102 such that the module 102 should be disconnected. The alert condition may be an over-temperature, the module 102 being unable to hold charge and/or any other type of condition in which it may be advantageous to disconnect the module 102. If the module controller 112 is to disconnect the module 102 (step 610), the module controller 112 executes a disconnect module function (step 612). If the module controller 112 prompted the disconnect, the module controller 112 may report the alert condition to the pack controller 104. If the module 102 is already disconnected (step 614), the module controller 112 executes a connect module function (step 616).

If a charge command is received (step 618), the module controller 112 executes a charge module function (step 620). For example, the module controller 112 may command the charger 114 to provide the proper current level based on a predefined value from the pack controller 104. The module controller 112 may also ensure that the power supplied by the charger 114 is approximately the same as the power received by the module 102.

If a discharge command is received (step 622), the module controller 112 executes a discharge module function (step 624). As part of this function, the module controller 112 may notify the pack controller 104 if the current level exceeds a discharge cut-off current. For example, for some embodiments, the discharge cut-off current may be C/2. At the end of the discharge cycle, the state of health of the module 102 may be determined.

Although FIG. 6 illustrates one example of a method 600 for monitoring a state of charge for a battery using the module controller 112, various changes may be made to FIG. 6. For example, while shown as a series of steps, various steps in FIG. 6 could overlap, occur in parallel, occur in a different order, or occur multiple times. The method 600 may be implemented in a system that is used for peak shaving or energy storage or in any other suitable system.

Figure 7:
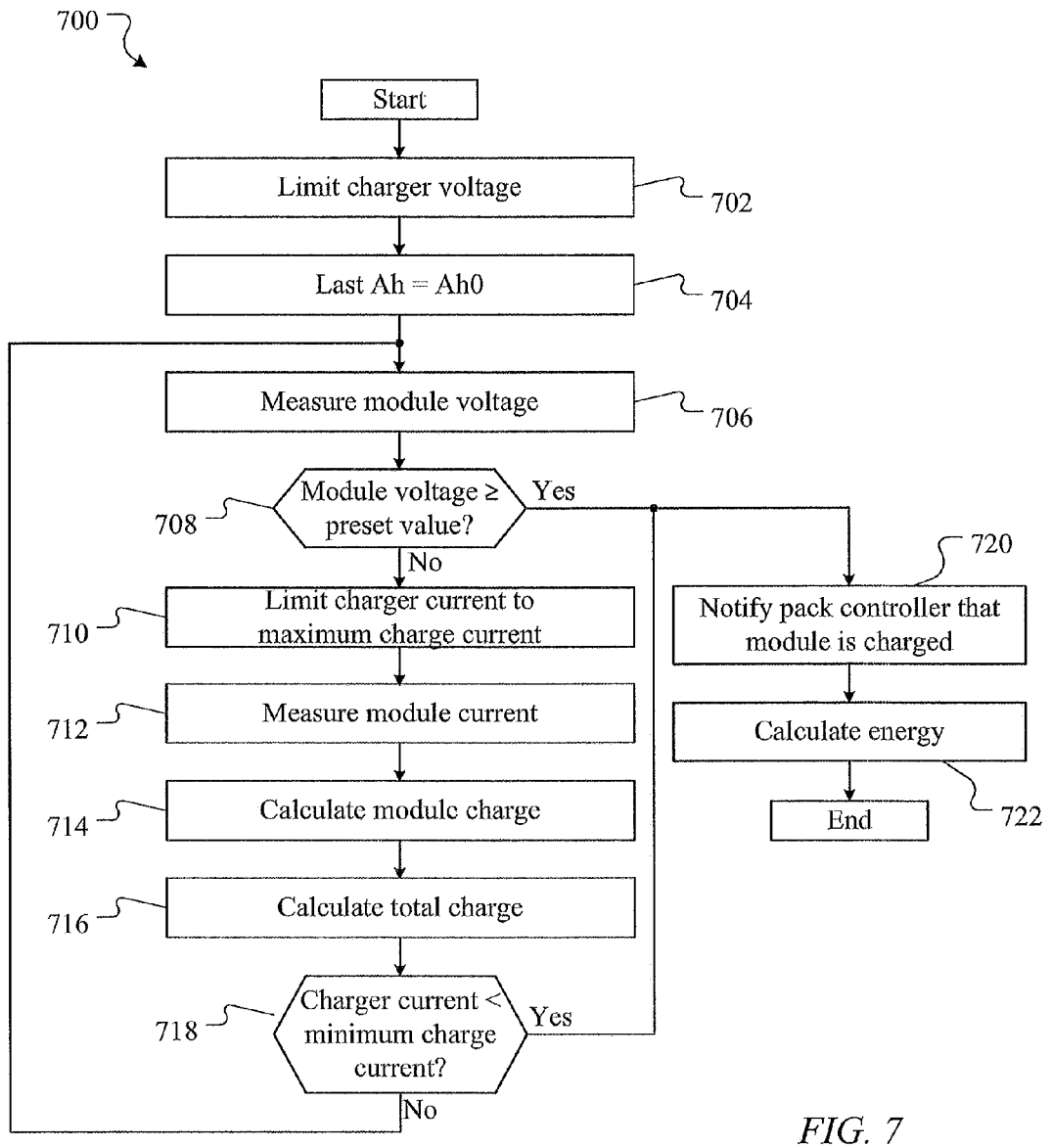
FIG. 7 is a flowchart illustrating a method for charging a module of FIG. 1, FIG. 2 or FIG. 3 in accordance with the present disclosure.

FIG. 7 is a flowchart illustrating a method 700 for charging a module 102 in accordance with the present disclosure. The method 700 shown in FIG. 7 is for illustration only. Charging of the module 102 may be provided in any other suitable manner without departing from the scope of this disclosure. In addition, the method 700 is described with respect to a single module 102; however, it will be understood that the method 700 may be performed for each module 102 in a pack 100.

The module controller 112 limits the voltage of the charger 114 (step 702), sets the last Ah to Ah0 (step 704), and measures the voltage of the module 102 (step 706). If the module voltage is less than a preset value (step 708), the module controller 112 limits the charger current to a maximum charge current (step 710). For example, for some embodiments, the maximum charge current may be C/4. The module controller 112 then measures the module current (step 712) and calculates the module charge (step 714). For example, the module controller 112 may calculate the module charge as follows:

$$\text{Charge (Ah)} = 1/3600\left(q0 + \frac{1}{\text{efficiency}} * \int I(t)dt\right).$$

The module controller 112 then calculates the total charge (step 716). For example, the module controller 112 may calculate the total charge, Sum(Ah), as follows:

$$\text{Sum}(Ah) = \text{Sum}(Ah) + Ah.$$

If the charger current is greater than or equal to a minimum charge current (step 718), the module controller 112 will again measure the module voltage (step 706), and the method 700 continues as before. For some embodiments, the minimum charge current may be C/100. If the charger current is less than the minimum charge current (step 718) or if the module voltage is greater than or equal to the preset value (step 708), the module controller 112 notifies the pack controller 104 that the module 102 is charged (step 720). The module controller 112 then calculates the energy (step 722), at which point the method 700 comes to an end. For example, the module controller 112 may calculate the energy, Energy(Ah), as follows:

$$\text{Energy}(Ah) = \text{Sum}(Ah) + Ah0.$$

Although FIG. 7 illustrates one example of a method 700 for charging a module 102, various changes may be made to FIG. 7. For example, while shown as a series of steps, various steps in FIG. 7 could overlap, occur in parallel, occur in a different order, or occur multiple times.

Figure 8:
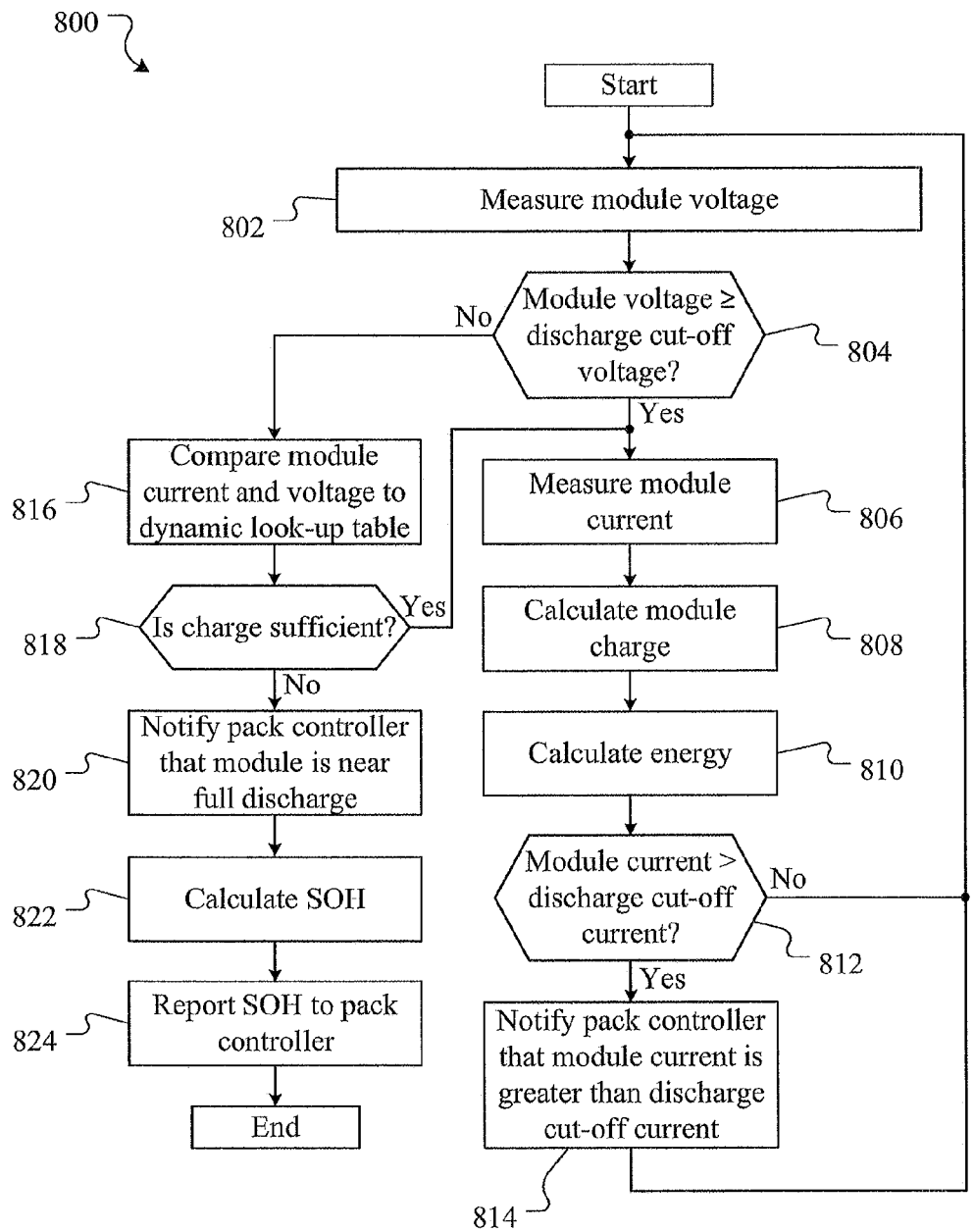
FIG. 8 is a flowchart illustrating a method for discharging a module of FIG. 1, FIG. 2 or FIG. 3 in accordance with the present disclosure.

FIG. 8 is a flowchart illustrating a method 800 for discharging a module 102 in accordance with the present disclosure. The method 800 shown in FIG. 8 is for illustration only. Discharging of the module 102 may be provided in any other suitable manner without departing from the scope of this disclosure. In addition, the method 800 is described with respect to a single module 102; however, it will be understood that the method 800 may be performed for each module 102 in a pack 100.

The module controller 112 measures the voltage of the module 102 (step 802) and compares the module voltage to a discharge cut-off voltage (step 804). If the module voltage is greater than or equal to the discharge cut-off voltage (step 804), the module controller 112 measures the module current (step 806) and calculates the module charge (step (808). For example, the module controller 112 may calculate the module charge as follows:

$$\text{Charge (Ah)} = 1/3600\left(q0 + \frac{1}{\text{efficiency}} * \int I(t)dt\right).$$

Then the module controller 112 calculates the energy (step 810). For example, the module controller 112 may calculate the energy, Energy(Ah), as follows:

$$\text{Energy}(Ah) = \text{Sum}(Ah) - Ah.$$

If the module current is not greater than a discharge cut-off current (step 812), the module controller 112 measures the module voltage again (step 802), and the method 800 continues as before. For some embodiments, the discharge cut-off current is C/2. If the module current is greater than the discharge cut-off current (step 812), the module controller 112 notifies the pack controller 104 that the module current is greater than the discharge cut-off current (step 814) before returning to step 802.

If the module voltage is less than the discharge cut-off voltage (step 804), the module controller 112 compares the module current and voltage to values in one or more dynamic look-up tables 516 in the memory 514 (step 816). The dynamic look-up tables 516 are configured to store empirical historical data of the module 102. Thus, the dynamic look-up tables 516 act as references of battery performance to determine how much charge is left. The module controller 112 updates the dynamic look-up tables 516 to adjust the values in the tables 516 for battery degradation. If the module controller 112 determines that the charge is sufficient based on the comparisons of the current and voltage to the dynamic look-up tables 516 (step 818), the method returns to step 806 and continues as before. However, if the module controller 112 determines that the charge is insufficient (step 818), the module controller 112 notifies the pack controller 104 that the module 102 is near full discharge (step 820).

The module controller 112 then calculates the state of health (SOH) of the module 102 (step 822). For example, the module controller 112 may calculate the SOH as follows:

SOH=Last $Ah$/original capacity.

The module controller 112 then reports the SOH to the pack controller 104 (step 824), at which point the method 800 comes to an end.

Although FIG. 8 illustrates one example of a method 800 for discharging a module 102, various changes may be made to FIG. 8. For example, while shown as a series of steps, various steps in FIG. 8 could overlap, occur in parallel, occur in a different order, or occur multiple times.

Figure 9:
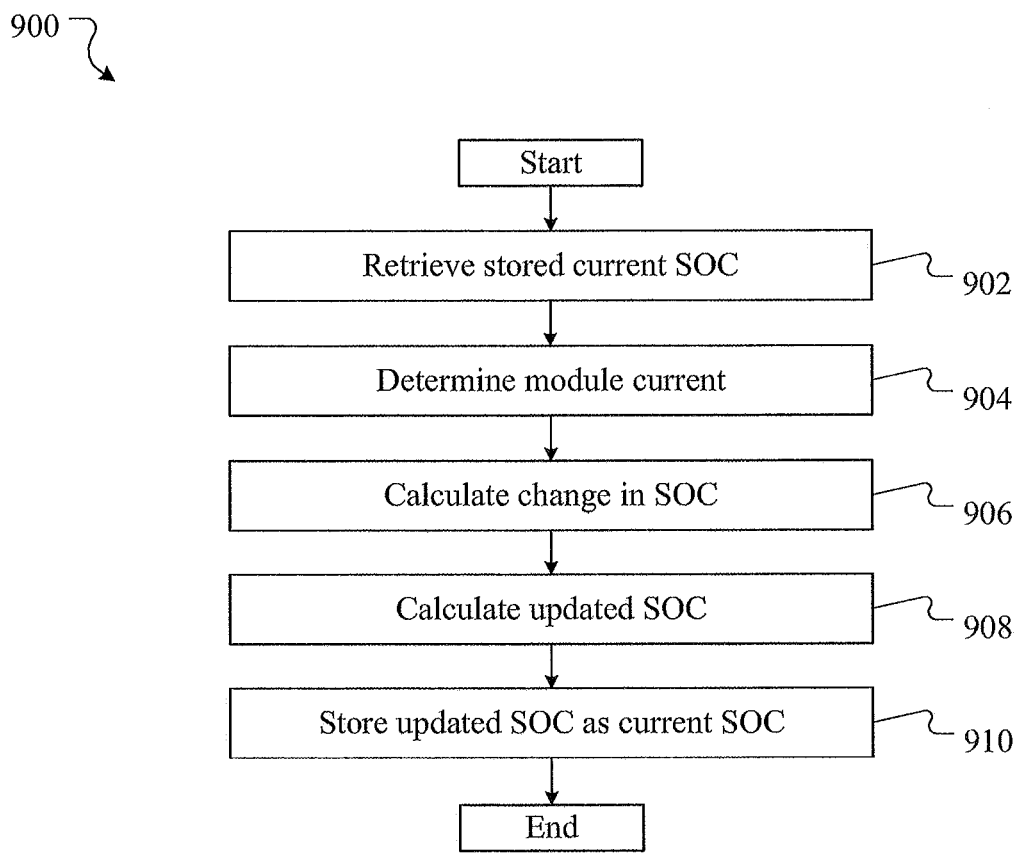
FIG. 9 is a flowchart illustrating a method for monitoring a state of charge for a battery using the module controller of FIG. 1 or FIG. 5 in accordance with the present disclosure.

FIG. 9 is a flowchart illustrating a method 900 for monitoring a state of charge for a battery using the module controller 112 in accordance with the present disclosure. The method 900 shown in FIG. 9 is for illustration only. The state of charge may be monitored in any other suitable manner without departing from the scope of this disclosure. In addition, the method 900 is described with respect to a single module 102; however, it will be understood that the method 900 may be performed for each module 102 in a pack 100.

The module controller 112 retrieves the current SOC from the memory 514 (step 902). Then the module controller 112 determines the module current (step 904) and calculates the change in the SOC (step 906). For example, the module controller 112 may calculate the change in the SOC, SOC_Del, as follows:

SOC_Del=$I*(1/F_{int})*eff$, where $F_{int}$ is the frequency of the interrupt.

Then the module controller 112 calculates the updated SOC (step 908). For example, the module controller 112 may calculate the updated SOC by adding SOC_Del to the current SOC retrieved in step 902. The module controller 112 then stores the updated SOC as the current SOC in the memory 514 (step 910), at which point the method comes to an end.

For some embodiments, the module controller 112 performs this method 900 by running a software interrupt. The software interrupt may run at a frequency of at least 2.2 times the switching frequency of the selected battery charger 114 to meet the Nyquist sampling theorem. The software interrupt may calculate the SOC by measuring the current at any given time. The interrupt uses the battery efficiency to accurately calculate the SOC.

Although FIG. 9 illustrates one example of a method 900 for monitoring a state of charge for a battery using the module controller 112, various changes may be made to FIG. 9. For example, while shown as a series of steps, various steps in FIG. 9 could overlap, occur in parallel, occur in a different order, or occur multiple times.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses may be performed by more, fewer, or other components. The methods may include more, fewer, or other steps. Additionally, as described above, steps may be performed in any suitable order.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The term "each" refers to each member of a set or each member of a subset of a set. Terms such as "over" and "under" may refer to relative positions in the figures and do not denote required orientations during manufacturing or use. Terms such as "higher" and "lower" denote relative values and are not meant to imply specific values or ranges of values. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for monitoring a battery pack, the battery pack comprising a plurality of modules and a pack controller, each module comprising a corresponding module controller, the method comprising, for each module:
    measuring a module current;
    measuring a module voltage;
    comparing the measured module current and the measured module voltage to state of health (SOH) data in at least one dynamic look-up table; and
    determining, by the module controller, a state of charge for the module based on the comparison of the measured module current and the measured module voltage to the SOH data in the at least one dynamic look-up table.

2. The method of claim 1, further comprising:
    initially configuring the at least one dynamic look-up table based on a type of battery chemistry for the battery pack; and
    for each of at least one of the modules, updating the at least one dynamic look-up table based on empirical data for the module after each charge cycle for the module.

3. The method of claim 2, wherein each module comprises a plurality of cells, and wherein the empirical data comprises one or more of aging information for each of at least one of the modules, a cycle life for each of at least one of the modules, and a number of cell failures for the cells of each of at least one of the modules.

4. The method of claim 1, further comprising executing a charge module function for each of at least one of the modules by, when the measured module voltage is less than a preset value:
limiting a charger current to a maximum charge current;
re-measuring the module current;
calculating a module charge based on the re-measured module current; and
calculating a total charge based on the module charge.

5. The method of claim 4, further comprising executing the charge module function for each of at least one of the modules by, when the measured module voltage is greater than or equal to the preset value:
notifying the pack controller that the module is charged; and
calculating an energy based on the total charge and a last charge value.

6. The method of claim 4, further comprising executing the charge module function for each of at least one of the modules by, when the measured module voltage is less than the preset value and when the charger current is less than a minimum charge current:
notifying the pack controller that the module is charged; and
calculating an energy based on the total charge and a last charge value.

7. The method of claim 1, further comprising executing a discharge module function for each of at least one of the modules by, when the measured module voltage is less than a discharge cut-off voltage:
comparing the measured module current and the measured module voltage to the SOH data in the at least one dynamic look-up table;
determining whether a module charge is sufficient based on the comparison of the measured module current and the measured module voltage to the SOH data; and
notifying the pack controller that the module is near full discharge when the module charge is determined to be insufficient.

8. The method of claim 7, further comprising executing the discharge module function for each of at least one of the modules by, when the measured module voltage is greater than or equal to the discharge cut-off voltage:
re-measuring the module current;
calculating a module charge based on the re-measured module current; and
calculating an energy based on the module charge.

9. The method of claim 8, further comprising executing the discharge module function for each of at least one of the modules by, when the measured module voltage is greater than or equal to the discharge cut-off voltage and when the re-measured module current is greater than a discharge cut-off current, notifying the pack controller that the module current is greater than the discharge cut-off current.

10. The method of claim 7, further comprising executing the discharge module function for each of at least one of the modules by, when the module charge is determined to be insufficient:
calculating a state of health for the module; and
reporting the state of health for the module to the pack controller.

11. The method of claim 1, further comprising, for each of at least one of the modules:
retrieving a stored, current state of charge for the module;
determining an updated module current for the module;
calculating a change in the state of charge for the module based on the updated module current;
calculating an updated state of charge for the module based on the retrieved state of charge and the change in the state of charge; and
storing the updated state of charge for the module.

12. A battery pack, comprising:
a pack controller; and
a plurality of modules, each module comprising a corresponding module controller and a plurality of cells,
wherein each module controller is configured to measure a module current, to measure a module voltage, to compare the measured module current and the measured module voltage to state of health (SOH) data in at least one dynamic look-up table, and to determine a state of charge for the corresponding module based on the comparison of the measured module current and the measured module voltage to the SOH data in the at least one dynamic look-up table,
wherein the pack controller is configured to communicate with the module controllers to monitor the state of charge for each of the modules, and
wherein the at least one dynamic look-up table is initially configured based on a type of battery chemistry for the battery pack and at least one of the module controllers is further configured to update the at least one dynamic look-up table based on empirical data for at least one of the corresponding modules after each charge cycle for the at least one corresponding module.

13. The battery pack of claim 12, wherein each module further comprises a charger configured to charge the cells for the module.

14. The battery pack of claim 12, wherein the cells for each module are coupled in series, and wherein a first string of the modules comprises modules that are coupled in series, a second string of the modules comprises modules that are coupled in series, and the first string of the modules is coupled in parallel with the second string of the modules.

15. The battery pack of claim 12, wherein each module controller comprises:
a current sensor configured to measure the module current;
a voltage sensor configured to measure the module voltage;
a temperature sensor configured to measure a temperature for the corresponding module;
a memory comprising the at least one dynamic look-up table, the at least one dynamic look-up table configured to store the SOH data; and
a state monitor configured to determine the state of charge for the corresponding module.

16. A module controller for a module in a battery pack, the module controller comprising:
a current sensor configured to measure a module current;
a voltage sensor configured to measure a module voltage;
a temperature sensor configured to measure a module temperature;
a dynamic look-up table configured to store state of health (SOH) data for the module; and
a state monitor configured to monitor a state of health and a state of charge for the module based on the module current, the module voltage, the module temperature, and the SOH data,
wherein the dynamic look-up table is initially configured based on a type of battery chemistry for the battery pack and, after each charge cycle for the module, is updated based on empirical data for the module.

17. The module controller of claim 16, wherein the state monitor comprises a Coulomb counter configured to measure a charge added to or subtracted from the module to calculate a capacity of the module.

18. The module controller of claim 16, wherein the state monitor comprises a plurality of field-programmable gate arrays (FPGAs) configured to analyze the module current, the module voltage, and the module temperature.

19. The module controller of claim 18, wherein the module controller is configured to be coupled to a pack controller of the battery pack through a plurality of fiber optic lines, and wherein the module controller comprises a plurality of optical transceiver chips configured to convert digital signals from the FPGAs into optical signals and a plurality of transceivers configured to transmit and receive data using the fiber optic lines.

20. The module controller of claim 16, wherein the module comprises a plurality of cells, and wherein the empirical data comprises one or more of aging information for the module, a cycle life for the module, and a number of cell failures for the cells of the module.

* * * * *